US007479624B2

(12) United States Patent
Morris

(10) Patent No.: US 7,479,624 B2

(45) Date of Patent: Jan. 20, 2009

(54) LASER LIGHT ACTUATION SYSTEM

(76) Inventor: Glenn Morris, 2708 S. Water St., Burnet, TX (US) 78611

(*) Notice: Subject to any disclaimer, the term of this patent is extended or adjusted under 35 U.S.C. 154(b) by 905 days.

(21) Appl. No.: 10/629,971

(22) Filed: Jul. 30, 2003

(65) Prior Publication Data

US 2005/0023447 A1 Feb. 3, 2005

(51) Int. Cl.
*H03K 17/78* (2006.01)
*H04Q 1/30* (2006.01)

(52) U.S. Cl. .......................... 250/214 SW; 250/208.4; 398/106; 340/531; 200/61.02; 102/201

(58) Field of Classification Search ............. 250/208.4, 250/214 SW; 398/106, 109-113; 340/531, 340/5.63, 309.16, 309.2, 5.1; 200/237, 61.02; 102/201
See application file for complete search history.

(56) References Cited

U.S. PATENT DOCUMENTS

| | | | | |
|---|---|---|---|---|
| 3,710,122 A | | 1/1973 | Burcher et al. | 398/106 |
| 3,897,753 A | | 8/1975 | Lee et al. | 119/51.02 |
| 4,463,706 A | | 8/1984 | Meister et al. | 119/51.02 |
| 4,830,617 A | | 5/1989 | Hancox et al. | 434/21 |
| 4,847,542 A | * | 7/1989 | Clark et al. | 318/560 |
| 4,866,849 A | | 9/1989 | Parra | 33/293 |
| 5,079,646 A | * | 1/1992 | Schwartz | 359/894 |

(Continued)

FOREIGN PATENT DOCUMENTS

EP 836150 A1 * 4/1998

OTHER PUBLICATIONS

Chapter 13 —Fiber-Optic Communications, 4 pages, accessed Jun. 10, 2003, http://216.239.41.100/search?q=chache:X5ouuWxtbfQJ:www.glencoe.com/ps/ee/books/fre . . . .

(Continued)

*Primary Examiner*—Stephen Yam
(74) *Attorney, Agent, or Firm*—Fish & Richardson P.C.; Kelly K. Kordzik

(57) ABSTRACT

A laser light actuation system for remotely and selectively actuating a function of a known apparatus. The system includes a laser module adapted to produce a known laser light signal, which is preferably sparsely modulated, the signal being suitable for transmission over a long distance. The system also includes a receiver module adapted to receive and detect the known laser light signal. The receiver module is also adapted to selectively produce an actuation signal in response to the known laser light signal to selectively actuate such an apparatus. The receiver module includes a timer operatively associated with the receiver module to selectively limit the time of actuation of such an apparatus in response to the laser light signal.

A laser light actuation method for remotely and selectively actuating a function of a known apparatus. The method includes the steps of producing a known laser light signal suitable for transmission over a long distance, receiving the known laser light signal, detecting the known laser light signal, producing selectively an actuation signal to selectively actuate such an apparatus in response to the step of detecting the known laser light signal, and limiting the time of actuation of such an apparatus selectively in response to the laser light signal. The step of receiving the known laser light signal preferably occurs at a location designated by a user.

Military applications are potentially provided by implementing infrared laser light signals, for example.

2 Claims, 3 Drawing Sheets

U.S. PATENT DOCUMENTS

| | | | | | |
|---|---|---|---|---|---|
| 5,280,557 | A | | 1/1994 | Nwasokwa | 570/160 |
| 5,473,501 | A | | 12/1995 | Claypool | 361/232 |
| 5,526,749 | A | * | 6/1996 | Teetzel | 102/213 |
| 5,541,695 | A | * | 7/1996 | Teremy et al. | 396/59 |
| 5,716,216 | A | | 2/1998 | O'Loughlin et al. | 434/22 |
| 5,719,622 | A | * | 2/1998 | Conway | 348/211.8 |
| 5,788,359 | A | | 8/1998 | Halsey et al. | 600/319 |
| 5,944,410 | A | | 8/1999 | Chiou et al. | 362/259 |
| 6,068,484 | A | | 5/2000 | O'Loughlin et al. | 434/22 |
| 6,104,313 | A | | 8/2000 | Boyd, II | 340/908.1 |
| 6,163,507 | A | | 12/2000 | Gholson | 368/12 |
| 6,190,022 | B1 | | 2/2001 | Tocci et al. | 364/259 |
| 6,208,257 | B1 | | 3/2001 | Choi | 340/635 |
| 6,315,568 | B1 | | 11/2001 | Hull et al. | 434/22 |
| 6,396,571 | B2 | | 5/2002 | Ohtomo et al. | 356/5.1 |
| 6,405,496 | B1 | * | 6/2002 | Stewart et al. | 52/185 |
| 6,690,003 | B2 | * | 2/2004 | Zak | 250/221 |
| 6,897,765 | B2 | * | 5/2005 | Kaje | 340/321 |
| 2002/0097587 | A1 | | 7/2002 | Krietzman et al. | 362/553 |
| 2002/0124779 | A1 | * | 9/2002 | Perkins | 109/47 |
| 2002/0146656 | A1 | | 10/2002 | Thigpen et al. | 431/253 |
| 2002/0196123 | A1 | | 12/2002 | Dichi et al. | 340/5.64 |
| 2003/0122665 | A1 | * | 7/2003 | Kaje | 340/531 |

OTHER PUBLICATIONS 1.7 Optical Waveguides and Fibers (E-1), Basic Concepts, 3 pages, accessed Jun. 10, 2003, http://cord.org.step_online/st17ei.htm.

* cited by examiner

LASER LIGHT ACTUATION SYSTEM

BACKGROUND OF THE INVENTION

1. Field of the Invention

The present invention relates generally to the field of remote actuation systems. More particularly, it concerns a laser light actuation system. Still more particularly, it concerns a laser light actuation system for actuating a feeder and a laser light actuation system for actuating a portal mechanism.

2. Description of Related Art

Remote actuation systems allow devices to be actuated by a user from a distance. Such systems are advantageous in a number of different settings. For example, a remote actuation system is advantageous when the remote device is in a hazardous environment as where a user must detonate explosives from a distance. Another situation in which remote actuation is advantageous is when the user's physical proximity to the device would preclude the device's ability to effectively achieve its purpose. For example, in the case of a feeder, physical proximity of the user to the feeder would preclude the feeder's ability to attract wild animals by dispensing feed. In other situations, it would simply be convenient for the user to actuate a device from a distance. For example, garage doors are frequently remotely actuated.

Two recent approaches to implementing remote actuation are accomplished through the use of radio signal technology and laser signal technology. Typically, the signal is known in some way, such as by use of a known signal having a fixed or modulated frequency, amplitude, or duration of the signal. The fact that the signal is known reduces the likelihood of accidental or unauthorized actuation of the remote device, which would be generally undesirable.

The primary advantage of radio actuation systems stems from the fact that radio signals are not directional in nature. Therefore, there is no need for the user to aim the radio signal at the radio receiver in order to achieve the desired actuation. However, the known radio actuation systems suffer from several shortcomings for certain applications. For example, the non-directional nature of radio signals, while conferring the aforementioned advantage, can also lead to accidental actuation of the remote device due to a radio signal originating from a different radio transmitter at the same frequency or having the same signal. Likewise, the prevalence of radio signals today may create interference that hinders effective operation of a radio actuation system. Furthermore, radio waves are fairly easy to intercept due to their lack of directionality and this may pose a security risk in some applications. The widespread public concern with unauthorized opening of garage doors is an example of such a security risk. Finally, current government regulation of radio transmission intensity for many applications limits their effective range to about one hundred feet or less.

An example of a radio actuation system for operating a feeder is shown in FIG. 1. A radio transmitter 12 produces a radio signal 14, which is detected by a receiver FIG. 16. In response to receipt of the radio signal 14, the receiver 16 produces an actuation signal 18, which is provided to the desired device, such as an electromechanical feeder apparatus 19. Other radio actuation systems may have different configurations, and the system shown in FIG. 1 is merely intended to show one example of a radio actuation system.

Laser actuation systems overcome several of the possible disadvantages that may be encountered in the known radio actuation systems. For example, the inherent directionality of laser technology enables laser actuation systems to be less subject to the risk of accidental actuation because a laser signal originating from a different laser module would have to be aimed at the laser receiver for accidental actuation to occur. Furthermore, so long as clear line of sight is maintained between the laser module and laser receiver, the incidence of interference is reduced relative to that experienced by known radio actuation systems. In addition, security is improved due to difficulty of interception of a laser signal relative to a radio signal. Finally, current government regulation of laser intensity for many common applications allows an effective range of up to 300 feet or even more.

While laser actuation systems known to the inventor overcome many shortcomings of the known radio actuation systems, they are also subject to shortcomings for certain applications or needs. For instance, as already mentioned, a clear line of sight must be maintained between the laser module and the laser receiver in order for the laser signal to reach the laser receiver and cause actuation to occur. Furthermore, the directional nature of the laser module requires accurate aiming of the laser light signal toward the laser receiver. The inventor has recognized that these aspects of laser actuation devices are advantageous and disadvantageous. While the need for a properly directed beam and a clear line of sight increase the difficulty of implementing successful actuation, these aspects also minimize or preclude the accidental actuation sometimes encountered with radio actuation devices. These aspects also yield to modification in a manner that increases security as will be discussed in greater detail below.

Laser actuation systems known to the inventor also do not allow for actuation of selected duration for controlled actuation of the subject device such as a feeder. For many applications, such as for feeders, the ability to control the duration of actuation is important.

Accordingly, it is desirable to provide a remote laser actuation system that accommodates controlled duration of actuation of the subject device. It is also desirable to better utilize the properties inherent to laser actuation devices to provide better security for certain applications.

BRIEF SUMMARY OF THE INVENTION

The present invention provides a laser light actuation system for remotely and selectively actuating a function of a known apparatus. The system includes a laser module adapted to produce a known laser light signal, which is preferably sparsely modulated, the signal being suitable for transmission over a long distance. The system also includes a receiver module adapted to receive and detect the known laser light signal. The receiver module is also adapted to selectively produce an actuation signal in response to the known laser light signal to selectively actuate such an apparatus. The receiver module includes a timer operatively associated with the receiver module to selectively limit the time of actuation of such an apparatus in response to the laser light signal.

In an alternative embodiment of the present invention, the laser light actuation system includes an electromechanical feeder operatively associated with the receiver module and adapted to be selectively actuated to release feed in response to detection of the known laser light signal by the receiver module. In another alternative embodiment, the laser light actuation system includes an electromechanical gate operatively associated with the receiver module and adapted to be selectively actuated in response to the detection of the known laser light signal by the receiver module. In a further alternative embodiment of the present invention, the laser light actuation system includes a detonator operatively associated with the receiver module and adapted to be selectively actuated to detonate in response to the detection of the known laser light signal by the receiver module.

In yet another alternative embodiment of the present invention, in order to achieve security, aesthetic, or other desired benefit, the receiver module is adapted to be concealed in use, either through its location in use, or through a selectively operable enclosure so that the user may selectively implement actuation of the laser actuation system. In still another embodiment of the present invention, the laser module is operatively associated with a telescopic sight to accommodate selective directing of the known laser light signal through use of the telescopic sight.

The present invention also provides a laser light actuation method for remotely and selectively actuating a function of a known apparatus. The method includes the steps of producing a known laser light signal suitable for transmission over a long distance, receiving the known laser light signal, detecting the known laser light signal, producing an actuation signal to actuate such a known apparatus selectively in response to the step of detecting the known laser light signal, and limiting the time of actuation of such an apparatus selectively in response to the laser light signal.

In an alternative approach utilizing the method of the present invention, the method includes the step of producing a known, sparsely modulated laser light signal suitable for transmission over a long distance.

Accordingly, the present invention provides a remote laser actuation system that accommodates actuation of a selected duration, while utilizing other advantages of laser technology. These and other advantages of the present invention will be more fully appreciated by the following detailed description of the invention.

BRIEF DESCRIPTION OF THE DRAWINGS

The following drawings form part of the present specification and are included to further demonstrate certain aspects of the present invention. The figures are not necessarily drawn to scale. The invention may be better understood by reference to one or more of these drawings in combination with the detailed description of specific embodiments presented herein.

DETAILED DESCRIPTION OF PREFERRED EMBODIMENTS

It will be understood by those skilled in the art that the present invention can be implemented in a number of different ways, within the scope of the claims appended hereto. A presently preferred embodiment of the invention will now be described below.

Figure 1:
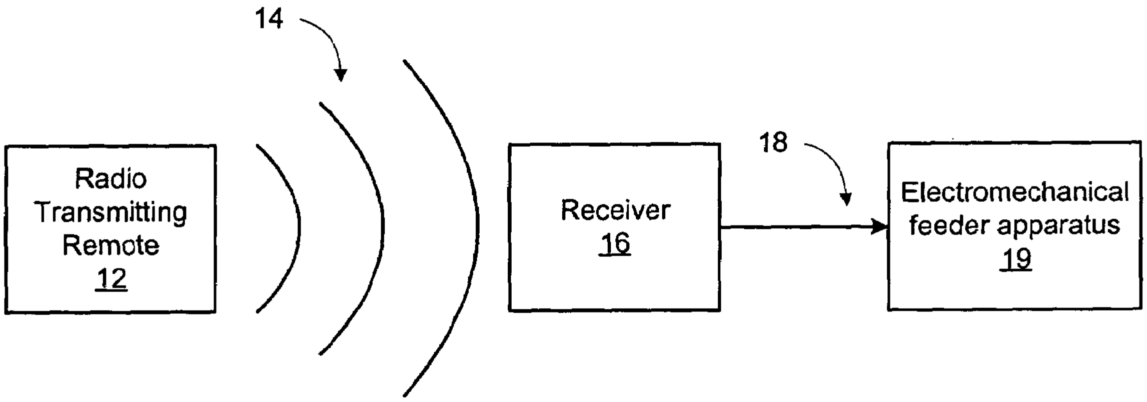
FIG. 1 (Prior Art)
FIG. 1 shows a schematic depiction of a radio actuation system of the prior art.
Figure 2:
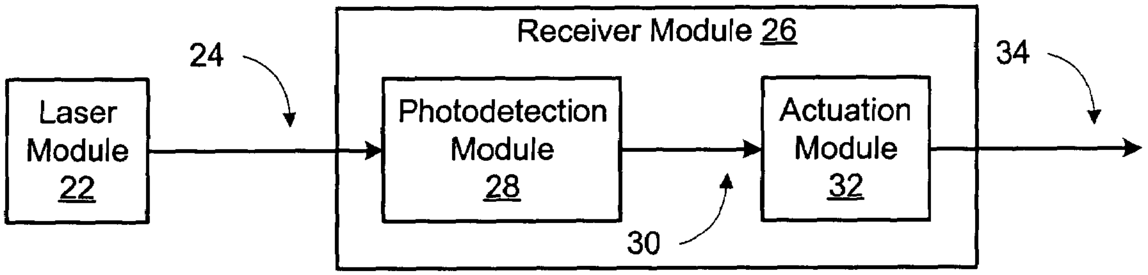
FIG. 2 shows a schematic depiction of a laser light actuation system, in accordance with an embodiment of the present invention.

FIG. 2 depicts a laser actuation system in accordance with the present invention. A laser module 22, which may be of any suitable sort to produce laser light for long distance transmission, produces a known laser light 24. Some possible laser modules for implementing the present invention are solid state, such as ruby, neodymium glass, and neodymium yttrium aluminum garnet, and gas, such as neon, hydrogen, argon, carbon monoxide, carbon dioxide, helium, and nitrogen. The laser module 22 of the preferred embodiment is a neodymium yttrium aluminum garnet laser, which was selected based on low price, high reliability, low power consumption, small size, high degree of safety, and ruggedness and durability. As will be appreciated by those skilled in the art, the preferred embodiment of the present invention implements the laser module using circuitry that could alternatively be implemented in integrated circuit form without departing from the spirit and scope of the claimed invention.

Known laser light 24 can be any laser output suitable for purposes of the present invention. Many alternatives exist for laser light 24 within the spirit and scope of the present invention, as will be appreciated by those skilled in the art. For example, laser light 24 may be visible or invisible, infrared, ultraviolet, or x-ray. In the preferred embodiment, highly coherent, highly collimated, red visible light has been selected.

Laser light 24 can be selectively focused suitably for transmission a desired distance. The laser light 24 of the preferred embodiment is focused so as to have a cross-sectional diameter of about 6 inches at a distance of about 100 yards from the laser module, and a cross-sectional diameter of about 2 feet at a distance of about 500 yards.

Characteristics of the known laser light 24 include wavelength, frequency, pulsing scheme, and others that can be used to discriminate the laser light 24 from other light, laser or otherwise. Laser light 24 can also be modulated in order to carry information. The modulation can vary any of the characteristics of the laser light 24: e.g., frequency, pulse width, pulse period, and so on.

As will be appreciated by those skilled in the art, photodetection module 28 of receiver module 26 can include any specific photodetection mechanism(s) suitable for detecting the laser light 24. Examples of photodetectors include photodiode photovoltaic that converts light into current, phototransistor, and photoconductor. The preferred embodiment implements a photodiode photoconductor, which has low power consumption in order to further make the preferred embodiment operate on low power to facilitate battery powered operation.

In response to detection of laser light 24, the photodetection module 28 provides a photodetection signal 30 to actuation module 32, in response to the receipt of which the actuation module 32 produces an actuation signal 34. The photodetection signal 30 can also be filtered in order to further discriminate the laser light 24. For example, a high pass filter may be employed in order to filter out signals resulting from the passage of cloud cover over the receiver module 26.

Production of an actuation signal 34 in response to receipt of a photodetection signal 30 can be handled by any of a great many suitable mechanisms, as will be appreciated by those skilled in the art. For example, the preferred embodiment utilizes an integrated circuit that executes program instructions in order to cause the actuation module 32 to output an actuation signal 34 at the proper time. The preferred embodiment counts and times pulses in order to further discriminate the laser light 24 on the basis of the photodetection signal 30. Other signals, such as a visual feedback signal, can be concurrently actuated other than the actuation signal.

Figure 3:
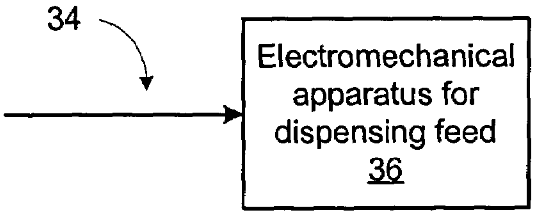
FIG. 3 shows a schematic representation of an electromagnetic apparatus for dispensing feed receiving an actuation signal, in accordance with an embodiment of the present invention.
Figure 4:
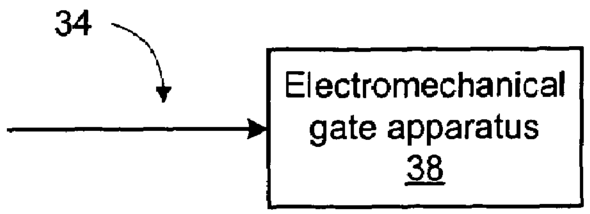
FIG. 4 shows a schematic representation of an electromagnetic gate apparatus receiving an actuation signal, in accordance with an embodiment of the present invention.
Figure 5:
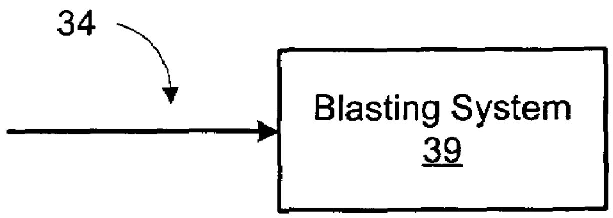
FIG. 5 shows a schematic representation of an blasting system receiving an actuation signal, in accordance with an embodiment of the present invention.

FIGS. 3-5 show the actuation signal 34 being provided to, respectively, an electromechanical apparatus for dispensing feed 36, an electromechanical gate apparatus 38, and a blasting system 39. Where the gate apparatus 38 is the final recipient of the actuation signal 34, the signal 34 is capture resistant relative to radio signal because an interceptor would have to be physically directly between the laser module and the receiver. Moreover, the receiver can be hidden from plain sight so even if someone could produce the known laser light 24, it would still be virtually impossible to trigger an actuation signal without knowing where the receiver had been hidden. Similarly, use of a receiver having limited directional sensitivity can increase the security of the actuation system.

Blasting systems achiever greater safety by the use of laser actuation triggers according to the present invention. Radio triggers have been widely used, but have dangers associated with nearby cell phones, walkie-talkies, and two-way radios that are entirely solved by the present invention.

Figure 6:
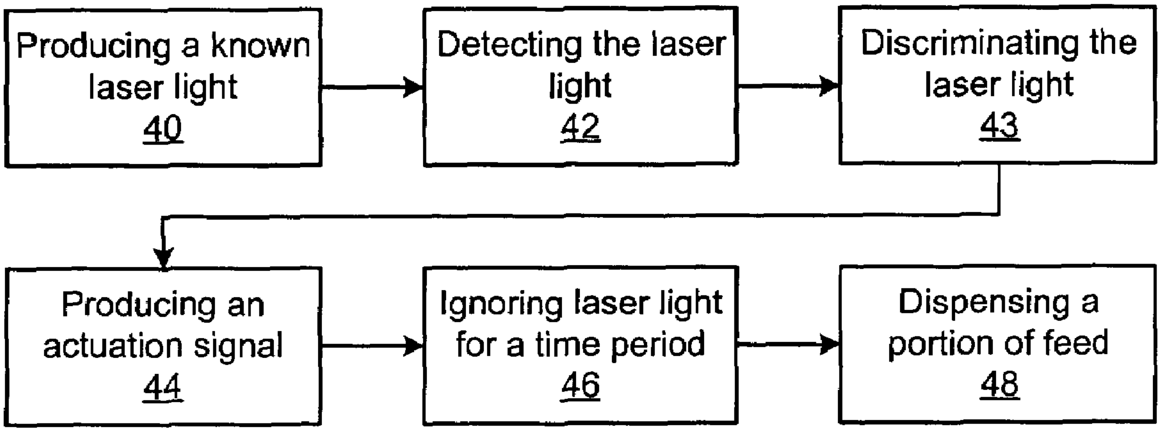
FIG. 6 shows a flowchart of a method of laser light actuation, in accordance with an embodiment of the present invention.

The present invention can also be implemented as a method shown in FIG. 6. A known laser light is produced (step 40). The laser light is detected (step 42) and discriminated (step 43). An actuation signal is produced (step 44). Laser light is subsequently ignored for a time period (step 46). A portion of feed is dispensed (step 48).

Laser light can be recognizable by virtue of its characteristics: e.g. wavelength, intensity, frequency, or pulsing scheme. While any such characteristics can be utilized to identify the laser light, it is preferred that pulse counting at a given frequency be utilized. One reason for such a preference is that power consumption approximates pulse duty cycle, which can be intentionally kept low by spacing out relatively brief pulses. Such pulse counting also helps the receiver discriminate known laser light from continuous light sources such as sunlight. Use of a relatively high frequency is desired in order to reduce the risk of hitting the receiver with some but not all pulses.

Any suitable mechanism for discriminating the known laser light will be appreciated by those of skill in the art as within the spirit and scope of the claims. In the preferred embodiment, Microchip Technology Inc.'s 12C508 microcontroller is used to discriminate the known laser light. Film or other material can be used to filter out light having certain characteristics in order to help discriminate the laser light.

Figure 7:
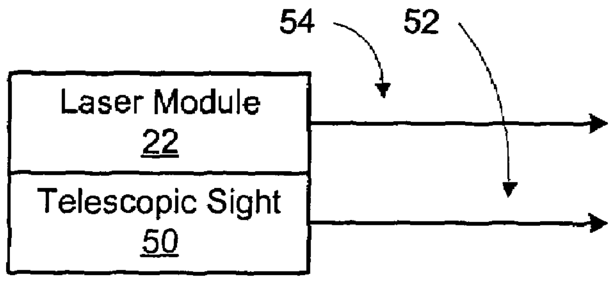
FIG. 7 shows a schematic illustration of a telescopic sight operatively associated with a laser module, in accordance with an embodiment of the present invention.

FIG. 7 shows a telescopic sight 50 having a line of sight 52 operatively associated with the laser module 22 so that the line of sight 52 is substantially aligned with output direction 54 of the laser module 22. The substantially aligned relationship between the line of sight 52 and the output direction 54 allow the laser module 22 to be accurately aimed based on the view through the telescopic sight 50. This allows the laser module 22 to be accurately aimed beyond the range in which the terminal "dot" of the laser light 24 would be visible to a user by aiming the line of sight 52 of the telescopic sight 50. For example, the telescopic sight might have crosshairs to further improve aiming of the laser module 22. It is not necessary that the line of sight 52 be exactly parallel to the output direction 54 in order to realize the benefits of substantial alignment.

Figure 8:
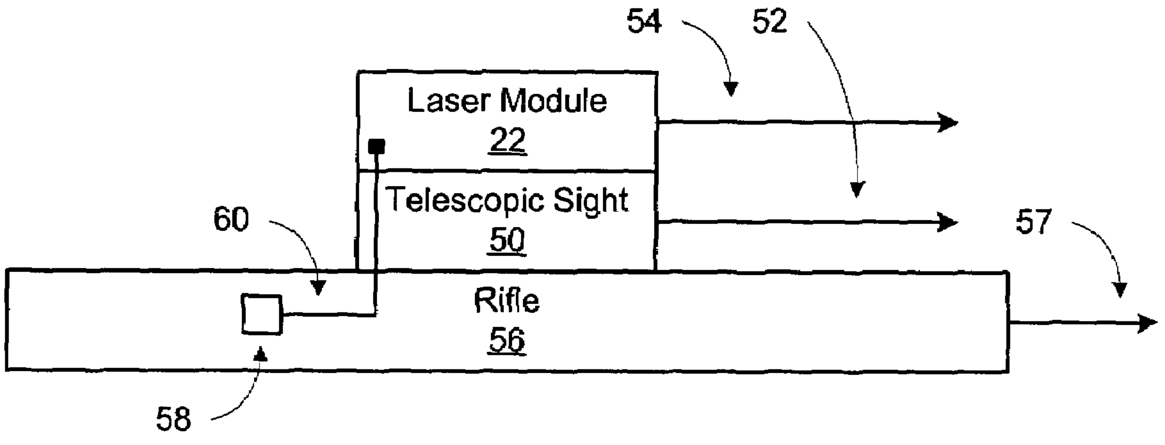
FIG. 8 shows a schematic drawing of a telescopic sight and a laser module mounted on a rifle, in accordance with an embodiment of the present invention.

As shown in FIG. 8, the laser module 22 and the telescopic sight 50 can be mounted on a rifle 56 so that the rifle can be held comfortably in the conventional firing position by a user while providing the user an opportunity to comfortably utilize telescopic sight 50. That is, the line of sight 52 of the telescopic sight 50 is substantially aligned with the firing direction 57 of the rifle 56. In addition, a manual switch 58 is operatively connectable to the laser module 22 in order to allow a user of rifle 56 to fire the laser module 22 while maintaining a comfortable firing grip on the rifle 56. The operative connection between the manual switch 58 and the laser module 22 can be any suitable mechanism, wireless or otherwise, and, in the preferred embodiment, is a connecting wire 60.

Any element in a claim that does not explicitly state "means for" performing a specified function, or "step for" performing a specific function, is not to be interpreted as a "means" or "step" clause as specified in 35 U.S.C. § 112, ¶ 6. In particular, the use of "step of" in the claims herein is not intended to invoke the provision of 35 U.S.C. § 112, ¶ 6.

It should be apparent from the foregoing that an invention having significant advantages has been provided. While the invention is shown in only a few of its forms, it will be understood by those skilled in the art that it is not limited to only those embodiments but is susceptible to various changes and modifications without departing from the spirit and scope of the invention. For example, multiple receiver modules may be used to improve the likelihood of at least one receiver module being hit by a laser light at great distance or under other conditions making accurate aiming of a laser module difficult.

Additionally, multiple receiver modules having different directional sensitivities may also be used to enable at least one receiver module to be hit by laser light coming from an angle not within the directional sensitivity of at least one other receiver module. For example, a gate system could be facilitated by the use of one receiver module directionally sensitive to laser light coming from one side of the gate, while another receiver module is directionally sensitive to laser light coming from the other side of the gate.

By way of further example, one receiver module can be configured to send actuation signals to several devices rather than a single device. For example, the sending of signals can be based on one or more of the following: simultaneous, alternative, and according to logic contained within the receiver module based on characteristics of the laser light or other factor.

As will be understood by those skilled in the art, and be within the spirit and scope of the claims, receiver modules can also be configured to have virtually any directional sensitivity. For example narrow directional sensitivity could be achieved by use of a receiving tube or by orienting the photodetector on the other side of an opening from the laser module, a conical refracting lens could provide directional sensitivity of about 360 degrees by 180 degrees, greater directional sensitivity could be achieved by use of other lenses.

As another variation, a laser light actuation system could be used to control functions of an automobile. For example, locking and unlocking car doors or starting and stopping the engine. The photodetection module could be oriented within the dome light, headlight, dashboard or other accessible location. Laser light actuation systems could be implemented to enable emergency vehicles to easily, securely, and reliably set upcoming signal lights to green.

Remote control toys could certainly incorporate the claimed invention in a wide variety ways that will be apparent to those skilled in the art. Military, recreational, and other laser-tag training could be implemented using laser light actuation systems of the claimed invention. Systems could store information concerning all hits, including who fired the laser module, when the hit occurred, and from how far away the laser module was fired.

In the preferred embodiment of the present invention, the laser light is not harmful to human eyes. However, variations falling within the spirit and scope of the claimed invention could include laser light of a nature harmful to human eyes.

These and other changes and modifications will be apparent to those skilled in the art in view of the above disclosure and are within the spirit and scope of the invention.

By way of further example of variations falling within the spirit and scope of the invention, use of the word "connect" or any of its derivatives in this specification and in the appended claims implies not only a direct, immediate connection between two recited parts, but also embraces the various arrangements wherein the parts are operatively connected, although other elements may be physically located or eliminated between the connected parts. Similarly, use of the words "send," "receive," or any of their derivatives in this specification and in the appended claims implies not only a direct, immediate transmission between two elements, but also embraces the various arrangements wherein the transmission operatively occurs, although other elements may intervene in the transmission, or the transmission between the two elements may otherwise occur indirectly. Additionally, the word "a" does not preclude the presence of a plurality of elements accomplishing the same function.

The word "gate" is defined herein to include any portal mechanism. By way of example, and not by way of limitation, the word "gate" includes the following: garage door, automatic door, sliding gate, movable barrier, gate arm, directional enforcement alligator teeth, and in-ground traffic barrier.

What is claimed is:

1. A laser light actuation system for remotely and selectively actuating a function of a known electromechanical gate, the system comprising: a laser module adapted to produce a known laser light signal suitable for transmission over a long distance; a laser receiver module adapted to receive and detect the known laser light signal and selectively produce an actuation signal in response to the known laser light signal to selectively actuate such an electromechanical gate operatively associated with the laser receiver module and adapted to be selectively actuated in response to the detection of the known laser light signal by the laser receiver module; and wherein the laser receiver module is adapted to be positioned in use in a selectively concealed location known to a user, wherein the laser light actuation system further comprises a radio module adapted to produce a known radio signal; and a radio receiver module adapted to receive and detect the known radio signal and selectively produce an actuation signal in response to the known radio signal to selectively actuate a barrier device operatively associated with the radio receiver module and adapted to be selectively actuated in response to the detection of the known radio signal by the radio receiver module in order to enable the laser receiver module to receive the known laser light signal.

2. A laser light actuation method for remotely and selectively actuating a function of a known electromechanical gate, the method comprising the steps of: producing a known laser light signal suitable for transmission over a long distance; receiving the known laser light signal at a selectively concealed location known to a user; detecting the known laser light signal; producing an actuation signal to actuate such an electromechanical gate selectively in response to the step of detecting the known laser light signal; and actuating the electromechanical gate selectively in response to the step of producing an actuation signal, wherein the laser light actuation method further comprises the steps of: producing a known radio signal; receiving the known radio signal; detecting the known radio signal; producing an actuation signal to actuate a barrier selectively in response to the step of detecting the known radio signal; and actuating the barrier selectively in response to the step of producing an actuation signal in order to enable the step of receiving the known laser light signal at the location designated by the user.

* * * * *

UNITED STATES PATENT AND TRADEMARK OFFICE

CERTIFICATE OF CORRECTION

PATENT NO. : 7,479,624 B2
APPLICATION NO. : 10/629971
DATED : January 20, 2009
INVENTOR(S) : Morris It is certified that error appears in the above-identified patent and that said Letters Patent is hereby corrected as shown below:

On the Title page,

[*] Notice: Subject to any disclaimer, the term of this patent is extended or adjusted under 35 USC 154(b) by 905 days.

Delete the phrase "by 905 days" and insert -- by 681 days --

Signed and Sealed this

Fourth Day of May, 2010

David J. Kappos
*Director of the United States Patent and Trademark Office*